(12) United States Patent
Nishikawa et al.

(10) Patent No.: US 7,470,595 B2
(45) Date of Patent: Dec. 30, 2008

(54) OXIDIZING A METAL LAYER FOR A DIELECTRIC HAVING A PLATINUM ELECTRODE

(75) Inventors: Nobuyuki Nishikawa, Kawasaki (JP); Hiroshi Minakata, Kawasaki (JP); Kouji Tsunoda, Kawasaki (JP); Eiji Yoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 58 days.

(21) Appl. No.: 11/497,344

(22) Filed: Aug. 2, 2006

(65) Prior Publication Data

US 2006/0286744 A1 Dec. 21, 2006

Related U.S. Application Data

(62) Division of application No. 10/745,967, filed on Dec. 29, 2003, now Pat. No. 7,102,189.

(30) Foreign Application Priority Data

Jan. 17, 2003 (JP) ............................. 2003-009631

(51) Int. Cl.
*H01L 21/20* (2006.01)
*H01L 21/76* (2006.01)
(52) U.S. Cl. ................ 438/381; 438/431; 257/E21.592
(58) Field of Classification Search ................ 438/381, 438/431; 257/E21.592
See application file for complete search history.

(56) References Cited

U.S. PATENT DOCUMENTS

| 5,313,089 | A | * | 5/1994 | Jones, Jr. ..................... 257/295 |
| 5,838,035 | A | * | 11/1998 | Ramesh ....................... 257/295 |
| 5,858,851 | A | | 1/1999 | Yamagata et al. |
| 6,429,088 | B1 | | 8/2002 | Lau |
| 6,559,499 | B1 | | 5/2003 | Alers et al. |
| 6,576,948 | B2 | | 6/2003 | Hofmann et al. |
| 6,627,938 | B2 | | 9/2003 | Kwok et al. |
| 6,727,140 | B2 | | 4/2004 | Basceri et al. |
| 2001/0002053 | A1 | | 5/2001 | Kwok et al. |

(Continued)

FOREIGN PATENT DOCUMENTS

JP         05-067792 A       3/1993

(Continued)

OTHER PUBLICATIONS

Japanese Office Action dated Sep. 20, 2005.

*Primary Examiner*—W. David Coleman
(74) *Attorney, Agent, or Firm*—Westerman, Hattori, Daniels & Adrian, LLP.

(57) ABSTRACT

A tight contact layer is disposed on a semiconductor substrate, the tight contact layer being made of one material selected from the group consisting of refractory metal, alloy of refractory metal, nitride of refractory metal, and siliconized nitride of refractory metal. An oxide surface layer is disposed on the surface of the tight contact layer, the oxide surface layer being made of oxide of material constituting the tight contact layer. A first conductive layer is disposed on the surface of the oxide surface layer, the first conductive layer being made of a platinum group or alloy which contains a platinum group. When a conductive layer made of metal such as a platinum group is formed on a tight contact layer, coverage and morphology can be prevented from being degraded.

5 Claims, 12 Drawing Sheets

U.S. PATENT DOCUMENTS

2004/0063275 A1   4/2004   Kim et al.

FOREIGN PATENT DOCUMENTS

| JP | 07-297364 A | 11/1995 |
| JP | 08-186236 A | 7/1996 |
| JP | 08-335679 A | 12/1996 |
| JP | 08-340091 A | 12/1996 |
| JP | 09-260600 A | 10/1997 |
| JP | 2002-057306 A | 2/2002 |

* cited by examiner

OXIDIZING A METAL LAYER FOR A DIELECTRIC HAVING A PLATINUM ELECTRODE

CROSS REFERENCE TO RELATED APPLICATION

This application is a divisional of application Ser. No. 10/745,967, filed Dec. 29, 2003.

BACKGROUND OF THE INVENTION

A) Field of the Invention

The present invention relates to a semiconductor device and its manufacture, and more particularly to a semiconductor device having a conductive layer made of a platinum group or alloy of a platinum group formed on a semiconductor substrate, and its manufacture.

B) Description of the Related Art

As the capacitance of a capacitor of a memory-based semiconductor device such as dynamic random access memories (DRAM) and ferroelectric memories (FRAM) becomes very large, the structure of the device is changing from a Metal-Insulator-Semiconductor (MIS) structure to a Metal-Insulator-Metal (MIM) structure. Materials of a ferroelectric film have been studied, including high dielectric materials such as tantalum oxide and strontium barium titanate and ferroelectric materials such as PZT and SBT. As the storage electrode of a capacitor, metal and conductive oxide excellent for its oxidation resistance is used. For example, such materials may be metal excellent for its oxidation resistance such as Ru, Ir and Pt, conductive oxide such as $RuO_2$ and $IrO_2$, conductive material having a perovskite structure such as SrRuO, as disclosed in Japanese Patent Laid-open Publications Nos. HEI-7-297364, HEI-8-335679 and HEI-8-340091.

An electrode made of these materials is formed by a physical film forming method such as sputtering and vapor deposition and thereafter by performing a heat treatment to improve tight contactness, reduce hillocks and pinholes and make the surface rough and the like.

Such metal of a platinum group has poor contactness with an insulating film. In order to enhance the tight contactness of a conductive film made of metal of a platinum group with an insulating film, a tight contact layer is disposed between the two films.

If a tight contact layer made of TiN, WN or the like is interposed when the inner surface of a contact hole having a high aspect ratio is covered with a conductive film made of metal of a platinum group or the like, coverage and morphology are degraded.

SUMMARY OF THE INVENTION

An object of this invention is to provide a semiconductor device and its manufacture method capable of suppressing coverage and morphology from being degraded when a conductive film made of metal such as a platinum group is formed on a tight contact layer.

According to one aspect of the present invention, there is provided a semiconductor device comprising: a tight contact layer disposed on a semiconductor substrate and made of one material selected from the group consisting of refractory metal, alloy of refractory metal, nitride of refractory metal, and siliconized nitride of refractory metal; an oxide surface layer disposed on a surface of the tight contact layer and made of oxide of material constituting the tight contact layer; and a first conductive layer disposed on a surface of the oxide surface layer and made of a platinum group or alloy which contains a platinum group.

According to another aspect of the present invention, there is provided a method of manufacturing a semiconductor device comprising the steps of: forming a tight contact layer on a surface of an underlying substrate, the tight contact layer being made of one material selected from the group consisting of refractory metal, alloy of refractory metal, nitride of refractory metal, and siliconized nitride of refractory metal; oxidizing a surface of the tight contact layer; and forming a first conductive layer on a surface of the oxidized tight contact layer, the first conductive layer being made of a platinum group or alloy which contains a platinum group.

By oxidizing the surface of a tight contact layer, coverage of a first conductive layer disposed on the tight contact layer can be improved.

DESCRIPTION OF THE PREFERRED EMBODIMENTS

Figure 1A:
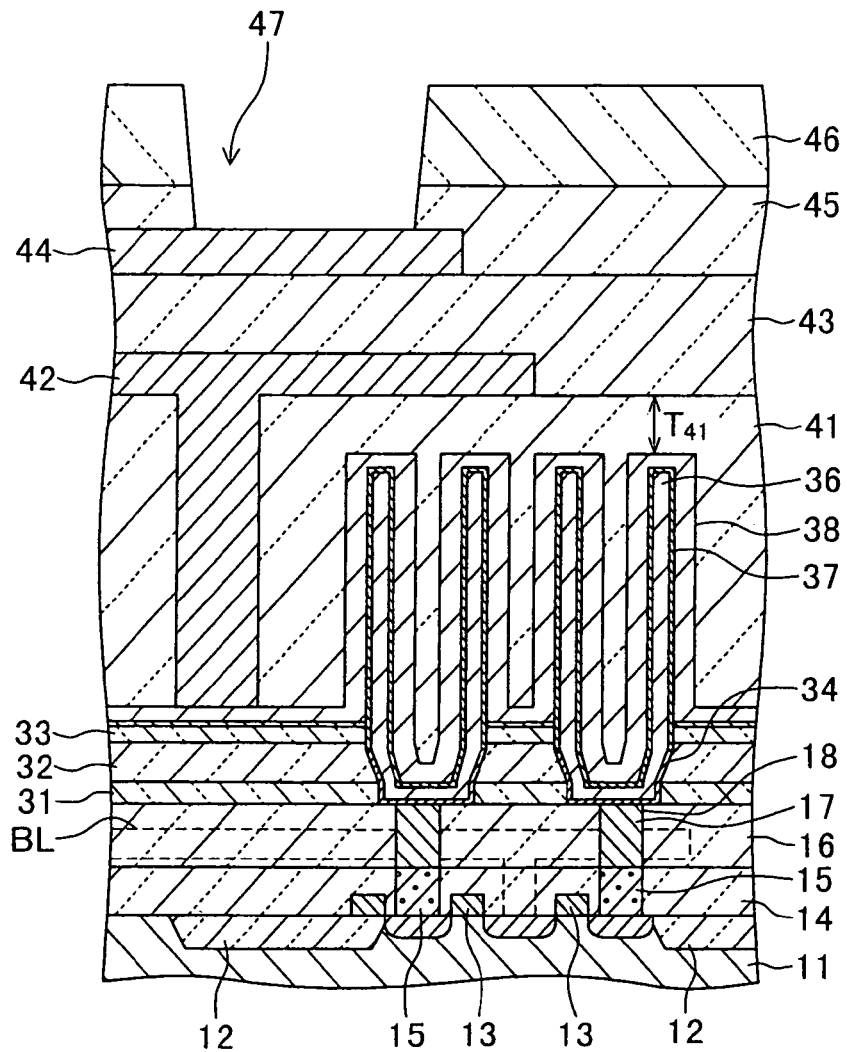
FIG. 1A is a cross sectional view of a semiconductor device according to an embodiment of the invention.

FIG. 1A is a cross sectional view of a semiconductor device according to an embodiment of the invention. The semiconductor device of the embodiment is a DRAM. With reference to FIG. 1A, a method of manufacturing a semiconductor device of the first embodiment will be described.

An isolation region 12 of silicon oxide ($SiO_2$) is formed by shallow trench isolation (STI) on the surface of a semiconductor substrate 11 made of silicon and having a p-type surface layer region. On the surface of an active region defined by the isolation region 12, an insulating gate electrode 13 is formed.

Figure 1B:
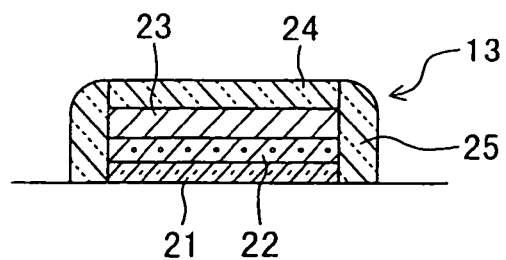
FIG. 1B is a cross sectional view of a gate electrode.

As shown in FIG. 1B, the insulating gate electrode 13 has: a gate insulating film 21 made of silicon oxide and formed on the silicon surface; a lower gate electrode 22 of polysilicon formed on the gate insulating film 21; an upper gate electrode 23 made of tungsten silicide (WSi) or the like and formed on the lower gate electrode 22; an etching stopper layer 24 made of silicon nitride (SiN) or the like and formed on the upper gate electrode 23; and side wall etching stoppers 25 made of silicon nitride or the like and covering the side walls of the gate electrode. For the simplicity of drawing, the insulated gate electrode 13 is drawn in a simplified shape in FIG. 1A.

Prior to forming the sidewall etching stoppers 25, ions are implanted to form source and drain regions by using as a mask the lamination structure from the gate insulating film 21 to the etching stopper layer 24.

After the insulating gate electrode 13 is formed, a first interlayer insulating film 14 of silicon oxide or the like is formed. Contact holes are formed through the first interlayer insulating film 14 in necessary areas thereof, and plugs 15 of polysilicon, tungsten (W) or the like are buried in the contact holes. The plug 15 can be formed by depositing a polysilicon or tungsten layer by CVD and removing unnecessary portions of the layer by chemical mechanical polishing (CMP) or the like.

Thereafter, a second interlayer insulating film 16 is formed over the whole surface of the substrate. The second interlayer insulating film 16 is formed in such a manner that an insulating film is once deposited to an intermediate level, a bit line BL is formed, and thereafter the remaining portion of the insulating film is deposited by burying the bit line BL therein. Contact holes 18 are formed through the second interlayer insulating film 16, reaching the lower plugs 15, and plugs 17 made of tungsten or the like are filled in the contact holes.

For example, the plug 17 is formed by depositing a barrier metal layer of TiN and a tungsten layer and removing unnecessary portions of the layers by CMP or the like. Thereafter, on the planarized surface of the second interlayer insulating film 16, a silicon nitride layer 31, a silicon oxide layer 32 and a silicon nitride layer 33 are sequentially deposited. This lamination layer becomes a support layer constituting a base for preventing fall-down of a capacitor to be formed later. The upper and lower silicon nitride layers 31 and 33 function as an etching stopper when silicon oxide layers are etched.

The processes from forming the plug 17 and forming a capacitor on the plug will be described with reference to FIGS. 2A to 2K. FIGS. 2A to 2K show the region of the first interlayer insulating film 14 and higher level layers, corresponding to only one capacitor.

Figure 2A:
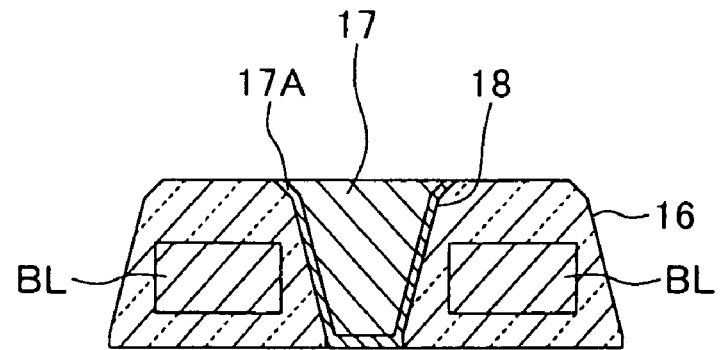
FIGS. 2A to 2K are partial cross sectional views illustrating a meted of manufacturing a semiconductor device according to an embodiment of the invention.

As shown in FIG. 2A, the bit line BL is buried in the first interlayer insulating film 16. Although FIG. 1A shows the bit line BL extending along a direction parallel to the drawing sheet, each of FIGS. 2A to 2K shows the cross section perpendicular to the extension direction of the bit line BL.

The contact hole 18 is formed through the first interlayer insulating film 16. The contact hole 18 is disposed in an area not overlapping the bit line BL, and the upper surface of the plug 15 shown in FIG. 1A is exposed on the bottom of the contact hole. Although FIG. 2A shows only one contact hole 18, other contact holes are also formed on the right and left sides of the first interlayer insulating film 16 shown in FIG. 2A.

The inner surface of the contact hole 18 and the upper surface of the first interlayer insulating film 16 are covered with a TiN layer. A tungsten layer is formed on the whole substrate surface, burying the contact hole 18. Unnecessary TiN layer and tungsten layer deposited on the upper surface of the first interlayer insulating film 16 are removed by CMP. This removal process therefore leaves a barrier metal layer 17A made of TiN and covering the inner surface of the contact hole 18 and a tungsten plug 17 filled in the contact hole 18.

Figure 2B:
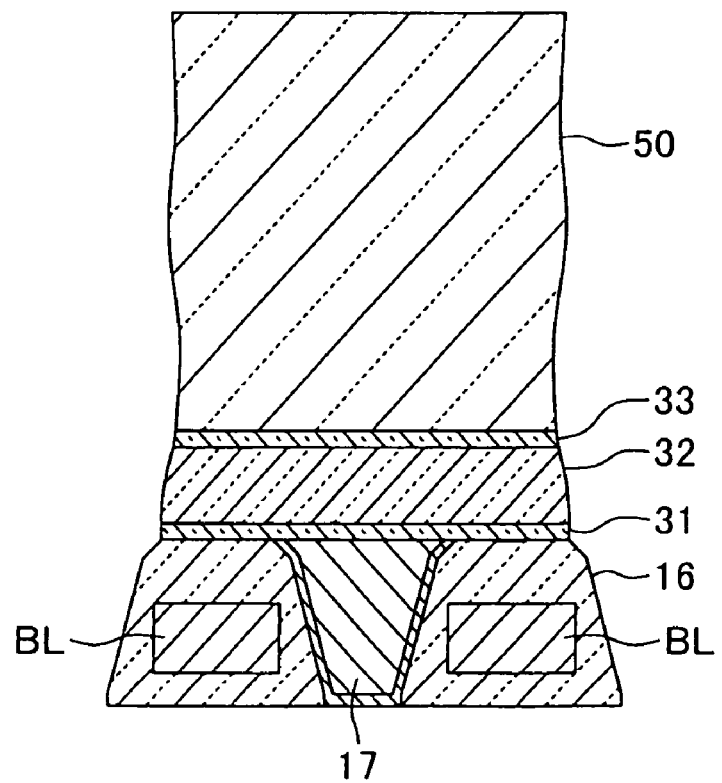

As shown in FIG. 2B, on the first interlayer insulating film 16, a silicon nitride layer 31 of 40 nm in thickness, a silicon oxide layer 32 of 100 nm in thickness and a silicon nitride film 33 of 40 nm in thickness are formed sequentially in this order. A sacrificial film 50 is formed on the silicon nitride layer 33, the film having a thickness of 900 nm and made of silicon oxide.

Figure 2C:
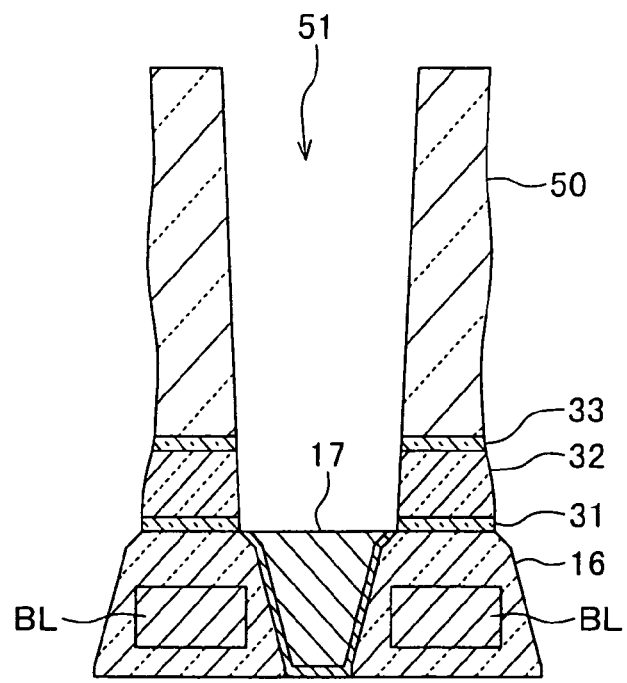

As shown in FIG. 2C, a hole 51 is formed through four layers from the sacrificial film 50 to the silicon nitride layer 31, in the area corresponding to the tungsten plug 17. The upper surface of the tungsten plug 17 is exposed on the bottom of the hole 51.

Figure 2D:
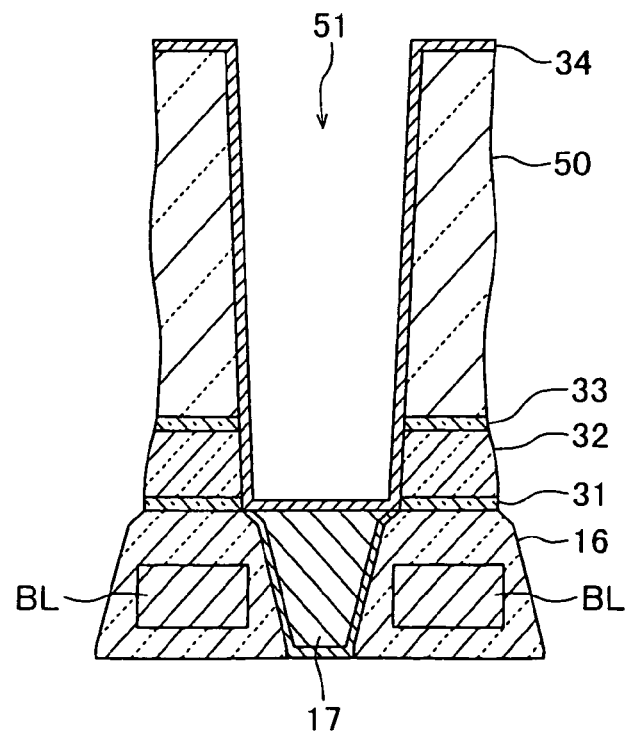

As shown in FIG. 2D, on the inner surface of the hole 51 and the upper surface of the sacrificial film 50, a tight contact layer 34 of 10 nm in thickness made of TiN is formed by chemical vapor deposition (CVD).

Figure 2E:
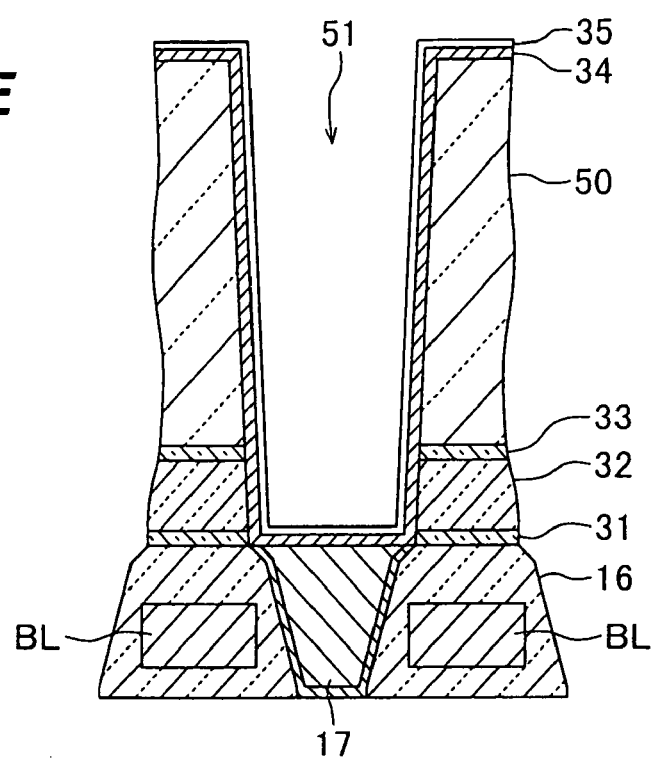

As shown in FIG. 2E, the surface layer of the tight contact layer 34 is oxidized to form an oxide surface layer 35. The thickness of the oxide surface layer 35 is set to 5 nm or thinner. The details of an oxidizing method will be later given.

Figure 2F:
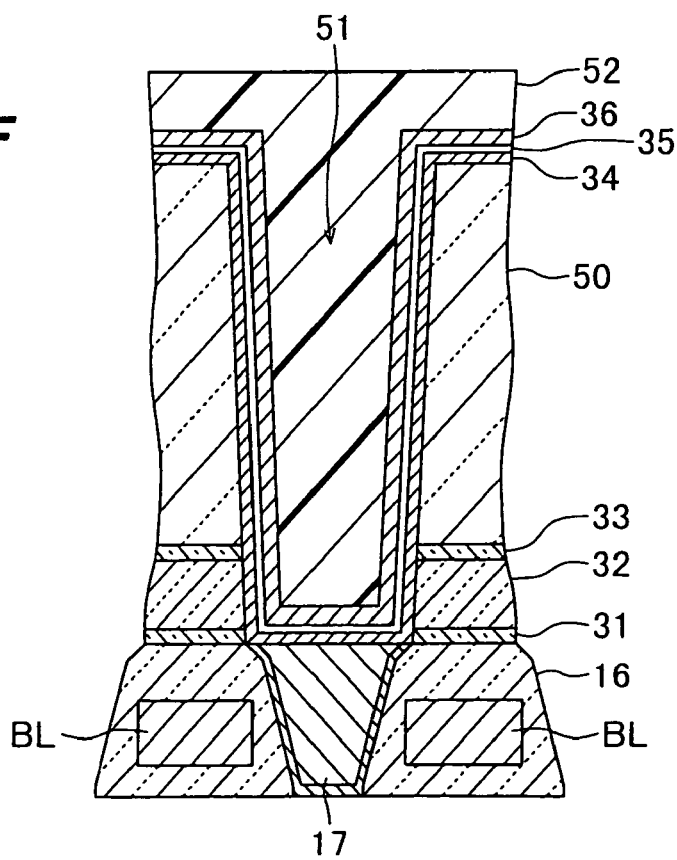

As shown in FIG. 2F, on the oxide surface layer 35, a ruthenium layer 36 of 20 nm in thickness is formed by CVD. On the ruthenium layer 36, resist material is coated to form a resist film 52. Part of the resist film 52 is buried in the hole 51. Instead of the resist material, spin-on-glass (SOG) material may be used.

Figure 2G:
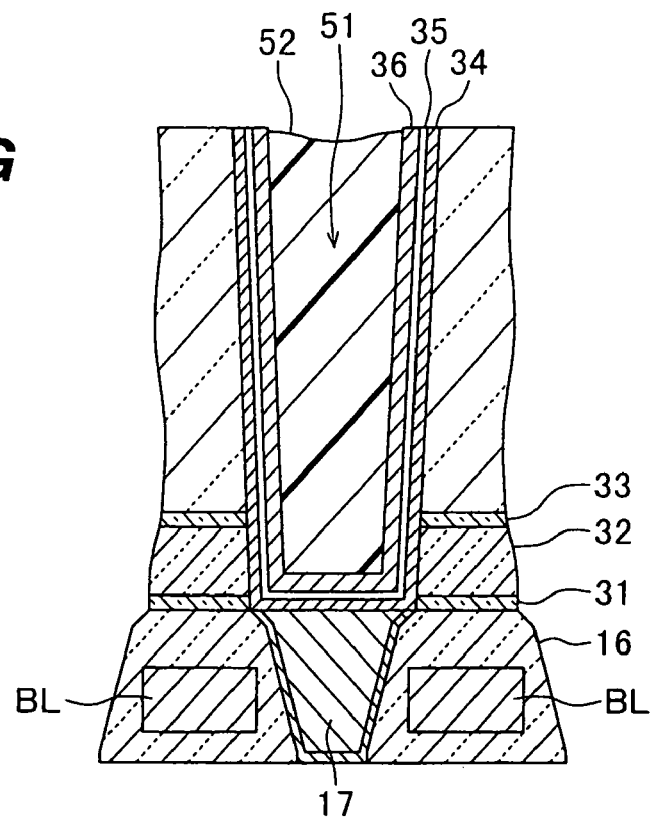

As shown in FIG. 2G, CMP is performed until the upper surface of the sacrificial film 50 is exposed. The tight contact layer 34, oxide surface layer 35, ruthenium layer 36 and resist film 52 are therefore left in the contact hole 51. It is possible to prevent slurry used in CMP from being left in the hole 51, because the resist film 52 is buried in the hole 51 before CMP. The oxide surface layer 35 and tight contact layer 34 on and above the sacrificial film 50 may be removed by etching instead of CMP.

Figure 2H:
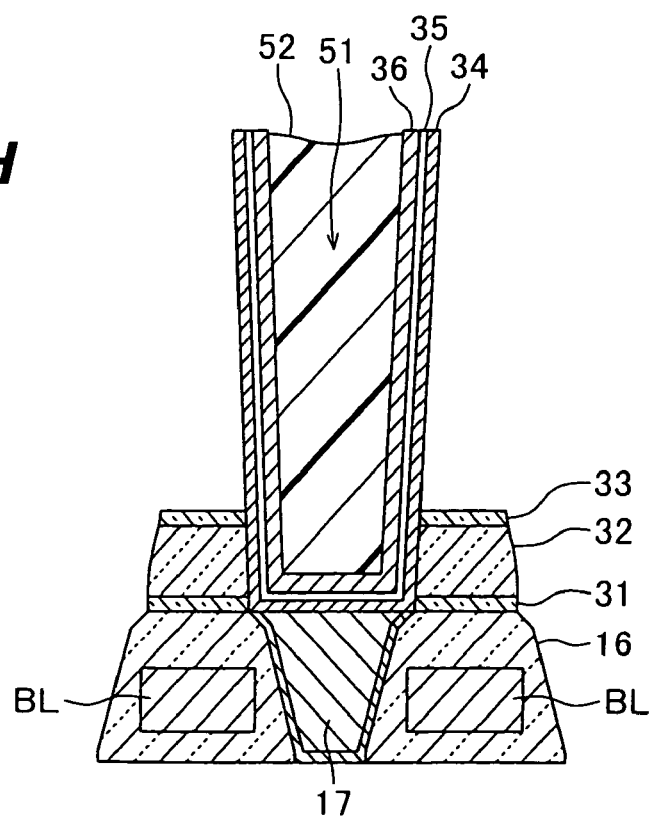

As shown in FIG. 2H, the sacrificial film 50 is removed by a wet process using hydrofluoric acid or the like.

Figure 2I:
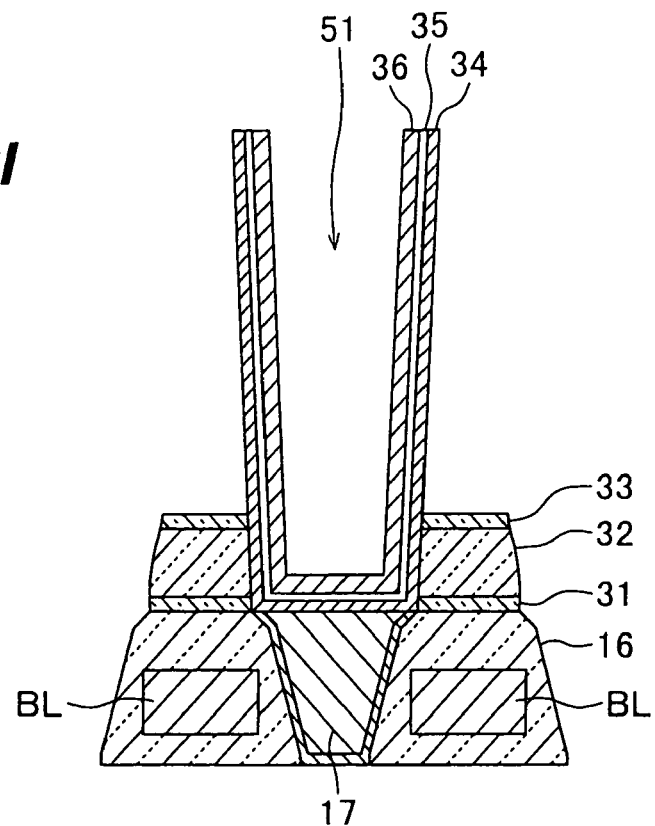

As shown in FIG. 2I, the resist film 52 filled in the hole 51 is removed. A cylindrical ruthenium layer 36 is therefore left. Two layers, the oxide surface layer 35 and tight contact layer 34, are left on the inner circumferential surface of the ruthenium layer 36. The inner circumferential surface of the ruthenium layer 36 is exposed. This ruthenium layer 36 is the storage electrode of a capacitor.

Figure 2J:
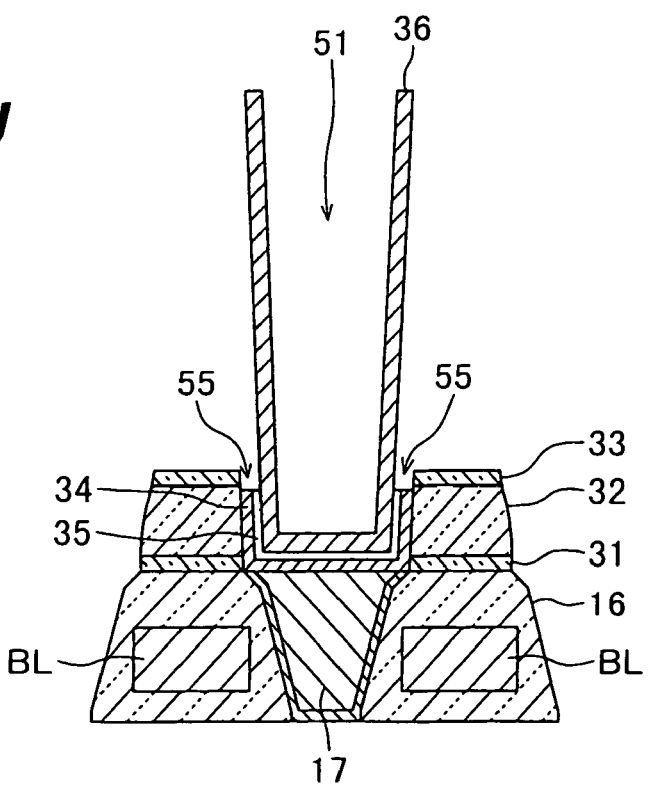

As shown in FIG. 2J, the tight contact layer 34 over the outer circumferential surface of the ruthenium layer 36 is removed by a wet process using sulfuric acid peroxide or ammonia peroxide. At this time, the oxide surface layer 35 is also removed so that the outer circumferential surface of the ruthenium layer 36 is exposed. Of the tight contact layer 34, a portion lower than the upper surface of the silicon nitride film 33 is also etched so that a slit 55 is formed between the outer circumferential surface of the ruthenium layer 36 and the inner circumferential surface of a recess defined by the silicon nitride layer 33 and silicon oxide layer 32.

Figure 2K:
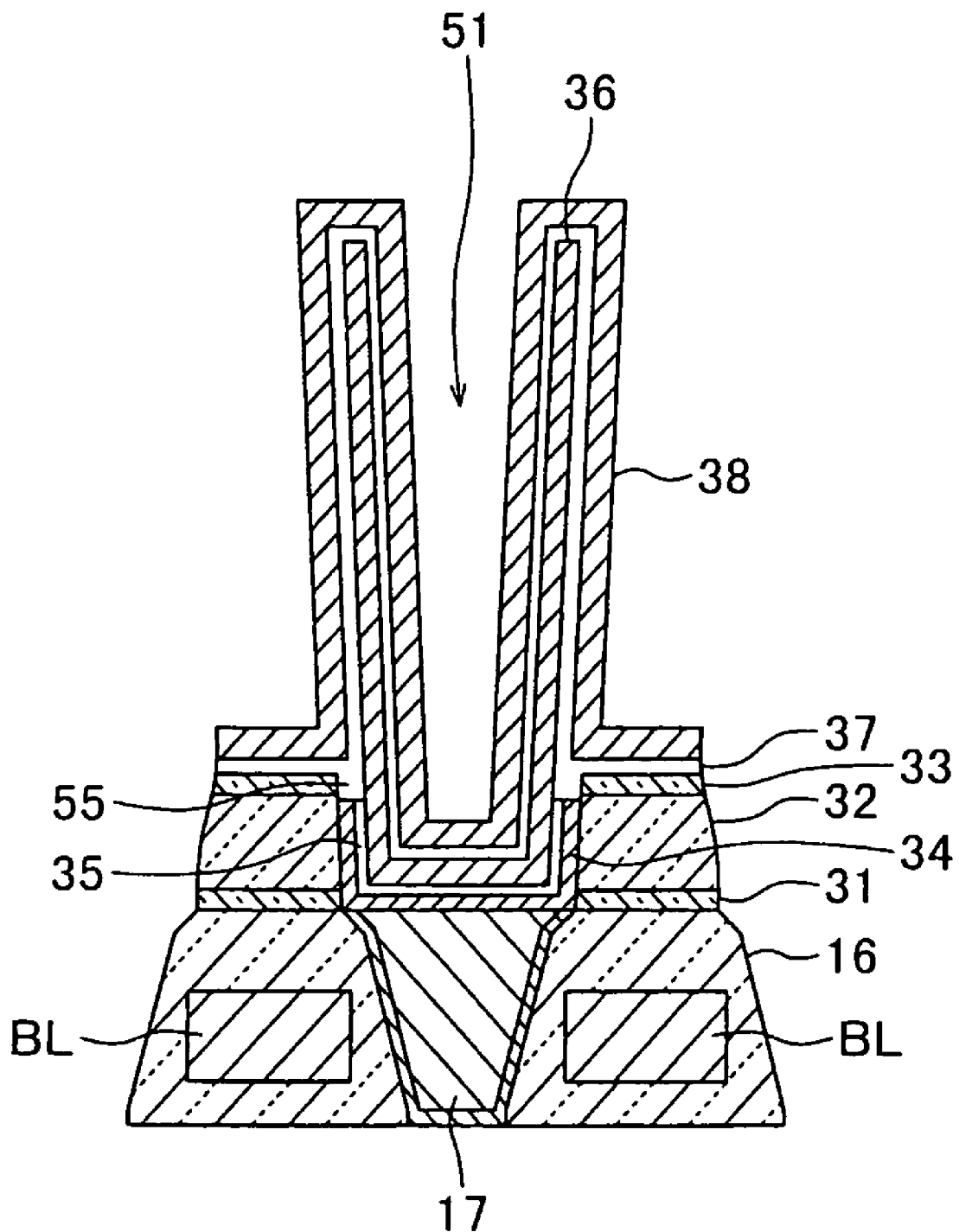

As shown in FIG. 2K, on the surface of the ruthenium layer 36 serving as the storage electrode of a capacitor, a tantalum oxide ($Ta_2O_5$) layer 37 of 10 nm in thickness is formed by CVD using source gas of $Ta(O(C_2H_5))_5$ at a substrate temperature of 400 to 500° C. The tantalum oxide layer 37 buries itself in the slit 55 formed by the retracted tight contact layer 34. The tantalum oxide layer 37 in direct contact with the tight contact layer 34 becomes thick so that an increase in local leak current can be prevented.

A ruthenium layer 38 of 30 nm in thickness is formed covering the surface of the tantalum oxide layer 37, by CVD using source gas of $Ru(EtCP)_2$ or $Ru(CP)_2$ at a substrate temperature of 300 to 400° C. With the processes described above, a capacitor is formed which is constituted of the ruthenium layer 36 as a lower electrode, the tantalum oxide layer 37 as a capacitor dielectric layer and the ruthenium layer 38 as an upper electrode.

Description will follow reverting to FIG. 1A. A third interlayer insulating film 41 of silicon oxide is formed over the whole substrate surface, burying the capacitors. A thickness $T_{41}$ of the third interlayer insulating film 41 at the top surface of the ruthenium layer 38 is 300 nm for example. A contact hole is formed through the third interlayer insulating film 41 in a predetermined area, and a portion of the ruthenium layer 38 serving as the upper electrode of a capacitor is exposed on the bottom of the contact hole. The contact hole is disposed in an area where the capacitor is not disposed.

On the third interlayer insulating film 41, a first layer aluminum wiring 42 of about 400 nm in thickness is formed. This aluminum wiring 42 is electrically connected to the ruthenium layer 38 via the contact hole formed through the third interlayer insulating film 41. A fourth interlayer insulating film 43 having a thickness of about 450 nm and made of silicon oxide is formed on the third interlayer insulating film 41, covering the aluminum wiring 42.

On the surface of the fourth interlayer insulating film 43, a second layer aluminum wiring 44 of about 900 nm in thickness is formed. This aluminum wiring 44 is electrically connected to a predetermined wiring at a lower level via a contact hole formed through the fourth interlayer insulating film 43.

On the fourth interlayer insulating film 43, a fifth interlayer insulating film 45 having a thickness of about 300 nm and made of silicon oxide is formed covering the aluminum wiring 44. These interlayer insulating films of silicon oxide are formed by CVD for example. On the fifth interlayer insulating film 45, a protective film 46 is formed having a thickness of about 600 nm and made of silicon nitride. An opening 47 is formed through two layers, the fifth interlayer insulating film 45 and protective film 46, and a portion of the aluminum wiring 44 is therefore exposed on the bottom of the opening 47.

Figure 3A:
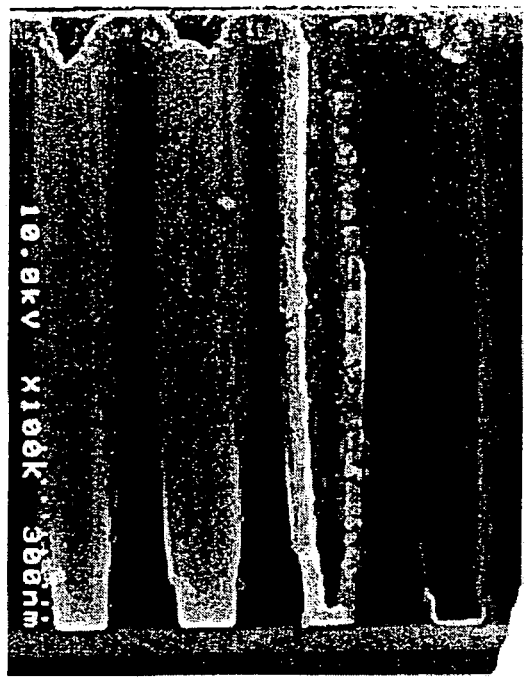
FIGS. 3A and 3B are SEM photographs showing a sample of cylindrical ruthenium layers formed by the embodiment method and their comparison sample, respectively.

FIG. 3A shows a cross sectional SEM photograph of the device structure after the ruthenium layer 36 shown in FIG. 2F is formed. Oxidizing the surface of the tight contact layer 34 was performed for 60 seconds in a down-flow plasma ashing system at an oxygen flow rate of 3 slm and a substrate temperature of room temperature. A thickness of the oxide surface layer 35 formed by this oxidizing process was about 5 nm. For the purposes of comparison, FIG. 3B shows a cross sectional SEM photograph of the device structure having a ruthenium layer formed without oxidizing the surface of a tight contact layer 34.

It can be seen that coverage of the ruthenium layer 36 particularly at the bottom of the hole is improved by oxidizing the surface of the tight contact layer 34 as in this embodiment. Surface morphology of the ruthenium layer 36 becomes better by oxidizing the surface of the tight contact layer 34.

Figure 4A:
FIGS. 4A and 4B are SEM photographs of samples of cylindrical ruthenium layers formed by the embodiment method.
Figure 4B:

FIGS. 4A and 4B show cross sectional SEM photographs of ruthenium layers when the surface of a tight contact layer 34 is oxidized by other methods. The SEM photograph shown in FIG. 4A is for a sample whose ruthenium layer was formed after an oxidation process for 30 minutes at a substrate temperature of 450° C. and in an atmosphere under an oxygen flow rate of 5 sccm and a nitrogen flow rate of 1000 sccm. A thickness of the oxide surface layer was about 5 nm. The SEM photograph shown in FIG. 4B is for a sample whose ruthenium layer was formed after an oxidation process in a ruthenium film forming CVD system for 10 minutes at a substrate temperature of 330° C. and in an atmosphere under an oxygen flow rate of 650 sccm and at a pressure of 133 Pa (1 Torr). A thickness of the oxide surface layer was about 3 nm.

Figure 3B:
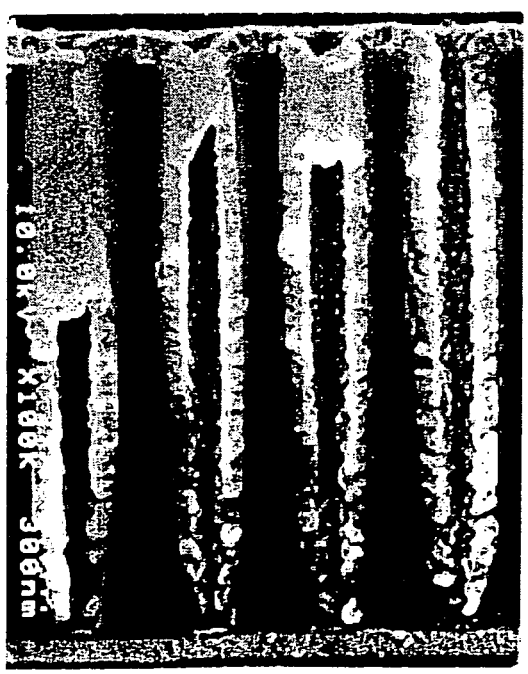

It can be seen in both samples that coverage and surface morphology of the ruthenium layer are improved more than without the oxidation process in FIG. 3B.

As described above, coverage and surface morphology of the ruthenium layer can be improved by oxidizing the surface of the tight contact layer of TiN to form an oxide surface layer of TiON on which the ruthenium layer is formed. Improvements on coverage and surface morphology of the ruthenium layer by oxidizing the surface of the tight contact layer may be ascribed to the inactive state of the surface of the tight contact layer caused by oxidation.

Figure 5A:
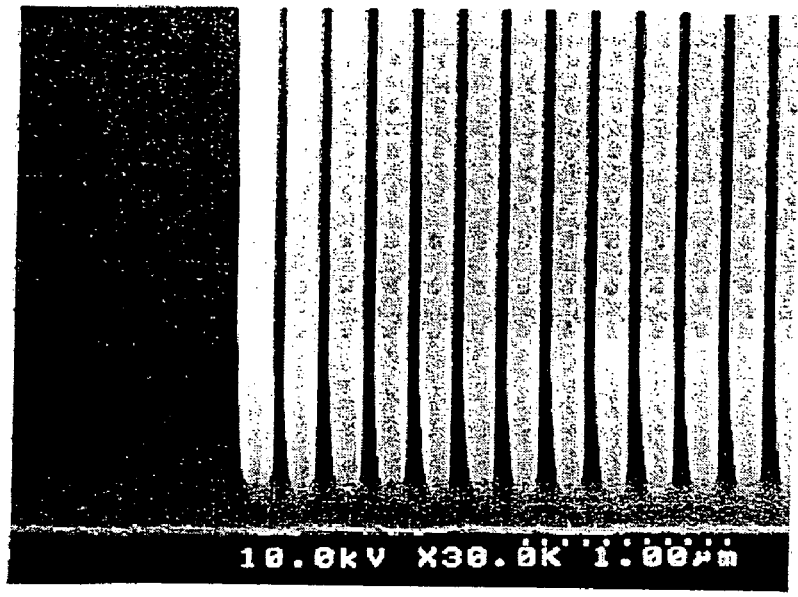
FIGS. 5A and 5B are SEM photographs showing a sample of cylindrical ruthenium layers formed by the embodiment method and their comparison sample, respectively.

FIG. 5A shows an SEM photograph of a sample in the state shown in FIG. 2J. In FIG. 2J the first interlayer insulating film 16 and tungsten plug 17 are disposed under the silicon nitride layer 31. In the sample shown in FIG. 5A, the whole region under the silicon nitride layer 31 is a tungsten layer. A thickness of the ruthenium layer was 20 nm. Fall-down of the cylinder made of the ruthenium layer and conduction failure between the ruthenium layer and tungsten layer did not occur.

Figure 5B:
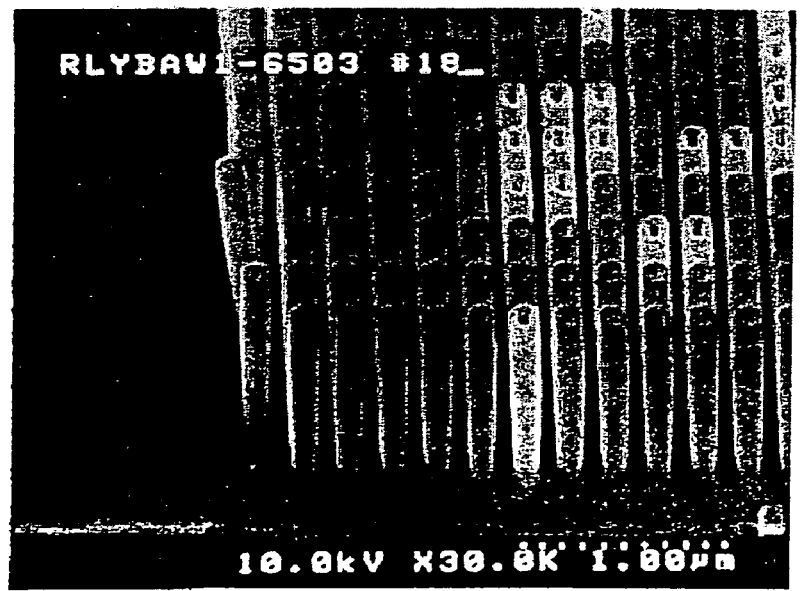

For the purposes of comparison, FIG. 5B shows an SEM photograph of a sample whose ruthenium layer is formed without oxidizing the surface of the tight contact layer 34. A thickness of the ruthenium layer was 30 nm. As seen, there are slanted cylindrical ruthenium layers. Many cylinders are photographed blackish. This is because conduction failure occurs between the cylinder and the underlying tungsten layer.

Figure 6A:
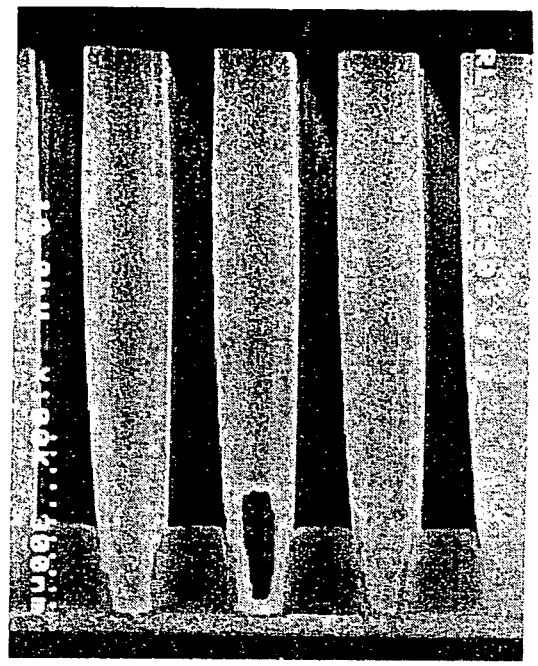
FIGS. 6A and 6B are SEM photographs showing a sample of cylindrical ruthenium layers formed by the embodiment method and their comparison sample, respectively.

FIG. 6A shows a cross sectional SEM photograph of the sample shown in FIG. 5A. For the purposes of comparison, FIG. 6B shows a cross sectional SEM photograph of the sample shown in FIG. 5B.

The region disposed near at the lower end of the cylindrical ruthenium layer in FIG. 6A corresponds to a support layer constituted of the silicon nitride layer 31, silicon oxide layer 32 and silicon nitride layer 33. The tungsten layer can be observed under the support layer.

Figure 6B:
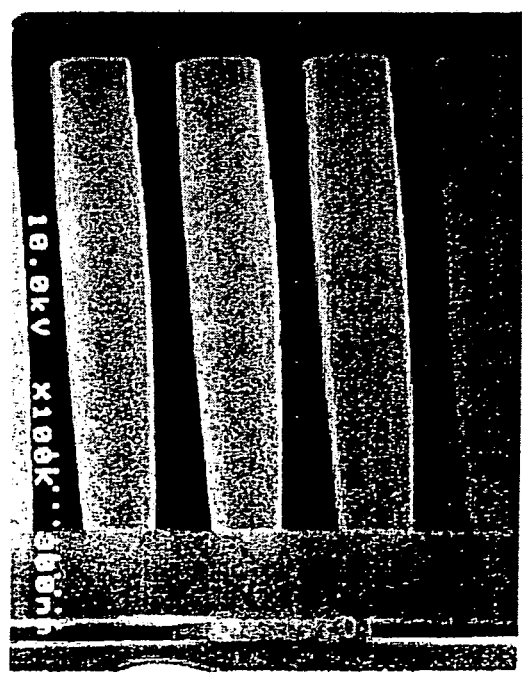

The support layer made of the silicon nitride layer 31, silicon oxide layer 32 and silicon nitride layer 33 appears under the cylindrical ruthenium film shown in FIG. 6B. FIG. 6B is the cross section taken in the gap between cylinders so that the support layer is continuous from the left to right end of the photograph. It can be seen that a portion of the tungsten layer under the three layers is etched and a void is formed. This may be ascribed to that when the tight contact layer 34 shown in FIG. 2J is etched, etchant reaches the tungsten layer via pin holes.

As in this embodiment, coverage of the ruthenium layer can be improved and occurrence of conduction failure can be prevented by oxidizing the surface of the tight contact layer 34 before the ruthenium layer 36 is formed.

Next, with reference to FIG. 7, description will be made on a preferred thickness of the oxide surface layer 35 shown in FIG. 2K.

Figure 7:
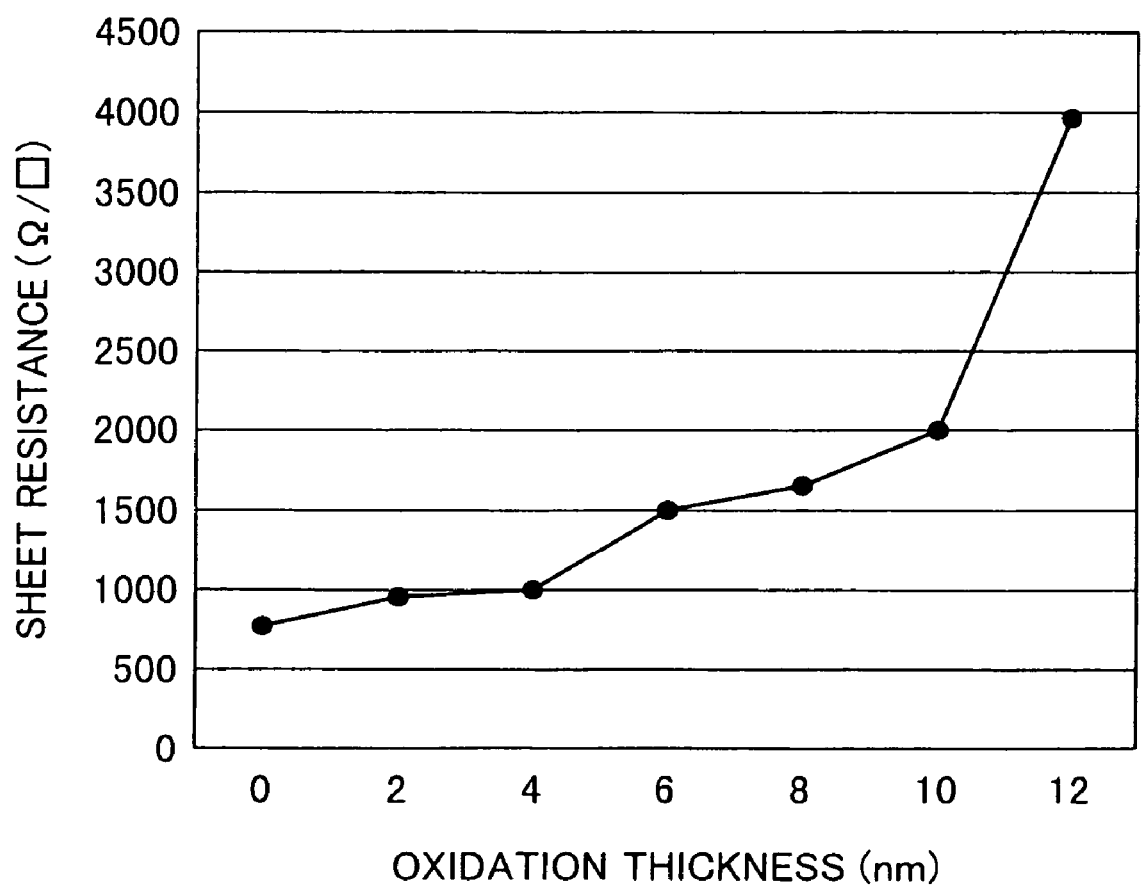
FIG. 7 is a graph showing the relation between the sheet resistance of a two-layer structure with the surface of a TiN layer being oxidized and the film thickness of an oxide layer.

FIG. 7 is a graph showing the relation between a sheet resistance and a thickness of a TiON layer respectively of the two-layer structure of a TiN layer of 10 nm in thickness and the TiON layer obtained by oxidizing the surface of the TiN layer. The abscissa represents a thickness of the TiON layer in the unit of "nm" and the ordinate represents a sheet resistance in the unit of "Ω/□". As the TiON layer becomes thicker, the sheet resistance becomes larger.

According to the evaluation results made by the present inventors, it has been found that the thickness of a TiON layer is preferably set to 1 nm or thicker in order to obtain sufficient coverage improvement effects of a ruthenium layer to be formed on a TiON layer. It is also preferable to set the thickness of a TiON layer to 5 nm or thinner in order to remove the TiON layer (oxide surface layer) 35 by wet etching.

If the thickness of the TiON layer is in the range from 1 to 5 nm, the sheet resistance of the two layers, TiN layer and TiON layer, is approximately 1000 "Ω/□" or lower. This sheet resistance is generally equal to that of the structure without the TiON layer. Influence of the TiON Layer upon an increase in resistance is slight.

In the embodiment described above, the surface oxidizing process for the tight contact layer 34 shown in FIG. 2E is performed by a thermal oxidation process in an oxidizing atmosphere, an oxidizing process using a down-flow plasma ashing system, or an oxidizing process using a CVD system to be used for forming a ruthenium layer. The oxidizing process may by other processes.

For example, if a barrier metal layer is formed by CVD, after this film formation, $O_2$ and $NH_3$ may be introduced into the chamber of the CVD system to generate $H_2O$ and oxidize the surface of the tight contact layer. After the tight contact layer is formed, the substrate is picked up from a CVD system and the surface of the tight contact layer is exposed to chemicals which contain oxygen element, such as water ($H_2O$), aqueous ozone ($O_3$), hydrogen peroxide ($H_2O_2$) and $HNO_3$. HCl or $H_2SO_4$ may be mixed to such chemicals to remove dusts. Heat treatment may be performed in a gas atmosphere which contains oxygen element such as ozone ($O_3$), water vapor ($H_2O$), $CO_2$, NO and $N_2O$. The surface of the tight contact layer may be exposed to plasma of these gasses.

In the embodiment described above, although TiN is used as the material of the tight contact layer, other materials may also be used. They may be refractory metal or its alloy such as titanium (Ti), tantalum (Ta), tungsten (W), zirconium (Zr), hafnium (Hf) and niobium (Nb), nitride of refractory metal such as tungsten nitride (WN), tantalum nitride (TaN), zirconium nitride (ZrN), hafnium nitride (HfN) and niobium nitride (NbN), or siliconized nitride of refractory metal such as TiSiN, TaSiN, WSiN, ZrSiN, HfSiN and NbSiN.

In the embodiment described above, although ruthenium is used as the material of the storage electrode of a capacitor, other metal of a platinum group or its alloy may be used such as Ir, Re, Pt, Pd, Rh and Os.

The present invention has been described in connection with the preferred embodiments. The invention is not limited only to the above embodiments. It will be apparent to those skilled in the art that other various modifications, improvements, combinations, and the like can be made.

What we claim are:

1. A method of manufacturing a semiconductor device comprising the steps of:

forming a tight contact layer over a surface of an underlying substrate, the tight contact layer being made of one material selected from the group consisting of refractory metal, alloy of refractory metal, nitride of refractory metal, and siliconized nitride of refractory metal;

oxidizing a surface of the tight contact layer; and forming a first conductive layer on a surface of the oxidized tight contact layer, the first conductive layer being made of a platinum group or alloy which contains a platinum group.

2. The method of manufacturing a semiconductor device according to claim 1, wherein a thickness of an oxide layer formed on the surface of the tight contact layer in the oxidizing step is 1 to 5 nm.

3. The method of manufacturing a semiconductor device according to claim 1, wherein the oxidizing step includes a step of exposing the tight contact layer to an atmosphere which contains at least one gas selected from the group consisting of $O_2$, $O_3$, $H_2O$, $CO_2$, NO and $N_2O$ or plasma of one gas selected from the group consisting of $O_2$, $O_3$, $H_2O$, $CO_2$, NO and $N_2O$.

4. The method of manufacturing a semiconductor device according to claim 1, wherein the oxidizing step includes a step of exposing the tight contact layer to liquid which contains at least one chemical selected from the group consisting of $H_2O$, $H_2O_2$, $HNO_3$, and aqueous ozone.

5. A method of manufacturing a semiconductor device comprising the steps of:

forming a tight contact layer over a surface of an underlying substrate, the tight contact layer being made of one material selected from the group consisting of refractory metal, alloy of refractory metal, nitride of refractory metal, and siliconized nitride of refractory metal;

oxidizing a surface of the tight contact layer; and forming a first conductive layer on a surface of the oxidized tight contact layer, the first conductive layer being made of a platinum group or alloy which contains a platinum group;

wherein the oxidizing step includes a step of exposing the tight contact layer to liquid which contains at least one chemical selected from the group consisting of $H_2O$, $H_2O_2$, $HNO_3$, and aqueous ozone; and wherein the liquid is mixed with HCl or $H_2SO_4$.

* * * * *